United States Patent [19]

Newiger et al.

[11] Patent Number: 4,707,116
[45] Date of Patent: Nov. 17, 1987

[54] EXPOSURE DEVICE

[75] Inventors: Winfried Newiger, Cleeberg; Wolfgang Walch, Liederbach; Harry Rach, Frankfurt; Michael Kiessling, Langenselbold, all of Fed. Rep. of Germany

[73] Assignee: Klimsch & Co. KG, Frankfurt am Main, Fed. Rep. of Germany

[21] Appl. No.: 884,430

[22] Filed: Jul. 11, 1986

[30] Foreign Application Priority Data

Jul. 17, 1985 [DE] Fed. Rep. of Germany ....... 3525482

[51] Int. Cl.⁴ .............................................. G03B 27/52
[52] U.S. Cl. ...................................... 355/30; 355/84; 355/113
[58] Field of Search ........................... 355/113, 84, 30; 362/218, 294, 373

[56] References Cited

U.S. PATENT DOCUMENTS

| | | | |
|---|---|---|---|
| 2,269,794 | 1/1942 | Stechbart | 362/294 |
| 2,344,558 | 3/1944 | Moore | 355/30 |
| 3,033,980 | 5/1962 | Pickering et al. | 355/30 |
| 3,157,362 | 11/1964 | Waly | 362/218 |
| 3,936,686 | 2/1976 | Moore | 362/294 |
| 3,986,018 | 10/1976 | Ishii | 355/30 |
| 4,293,899 | 10/1981 | Sanner | 362/294 |
| 4,630,182 | 12/1986 | Moroi et al. | 362/373 |

FOREIGN PATENT DOCUMENTS 817373 3/1981 U.S.S.R. ............................... 362/218

Primary Examiner—Monroe H. Hayes
Attorney, Agent, or Firm—Kurt Kelman

[57] ABSTRACT

The exposure device is especially intended for use with the contact print of circuit patterns on printed circuit boards, and is composed of a tubular light source extending with the length thereof throughout the exposure field width and disposed in a housing light-permeable over the exposure field, with the light source being disposed within a reflector open toward the exposure field and a light-directing grid covered by the side flanks of the reflector being located underneath the light source, and a heat insulating plate being provided underneath the light directing grid.

An occulting strip (5) is disposed between the light source (1) movable across the exposure field and the light directing grid (4), and the reflector (3) is provided with an air exhausting slit (6) extending throughout the entire length thereof, with the housing (8) provided with at least one air inlet port (7) and enclosing the reflector forming the outer part of a ventilation channel guided about the reflector (3) and guided through the reflector.

9 Claims, 9 Drawing Figures

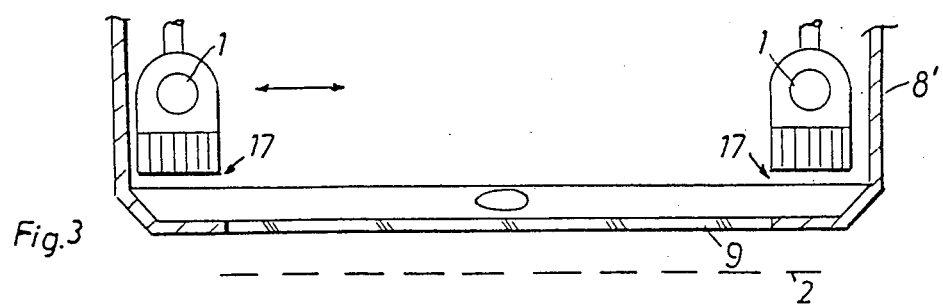
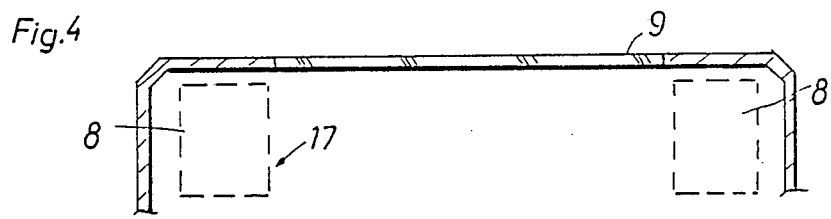
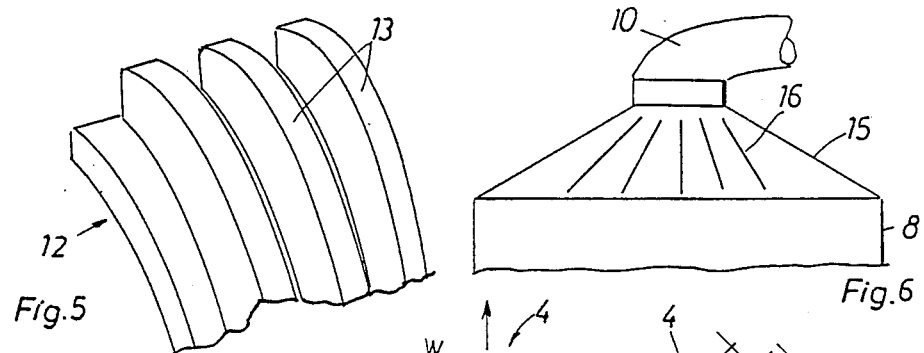
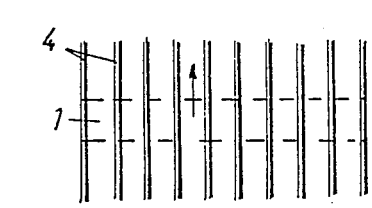
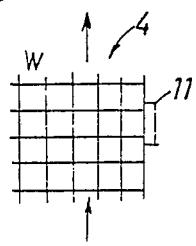
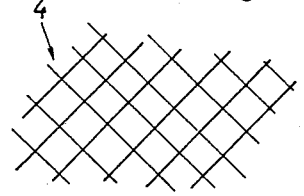

EXPOSURE DEVICE

BACKGROUND OF THE INVENTION

1. Field of the Invention

The present invention is concerned with an exposure device and is especially intended for the contact print of circuit patterns on circuit boards, but is also suitable for use, for example, with the multilayer technique, the so-called hybrid technique (gate arrays) and the contact print of other printing copies.

2. Description of the Prior Art

Exposure devices of this type, so-called moving lights, are disclosed by DOS No. 29 25 153. These are housings movable across the exposure field in which is provided a tubular light source above a light passage slit located at the bottom side in the housing.

Exposure devices of the afore-mentioned type are known from DOS No. 33 40 653, especially in connection with a device for the printed circuit board exposure in which a so-called circuit board package is pushed through the device thereby being exposed to the stationary exposure source. According to the non-prior-published U.S. application Ser. No. 813,728 now U.S. Pat. No. 4,666,294 a device is suggested permitting an essentially improved circuit board exposure.

However, a weak point exhibited by the construction and way of operation of the state-of-the-art device resides in the actual exposure cycle in respect of which is provided a surface exposure by suitable means, requiring correspondingly extended exposure times. When providing a plurality of luminescent tubes covering the entire exposure field, a uniform scattering and distribution of the intensity will be required likely to result in substantial losses and a non-uniform irradiaton of the circuit boards. When providing a light source to which a correspondingly high energy is supplied and the light of which is fed to the exposure field, for example, via mirrors, extended exposure times result envolving a slow polymerization of the photoresist. The use of so-called moving lights as taught, for example, by DOS No. 29 25 153, admittedly, is a suitable approach to solving the exposure problem because the required high exposure energy can be charged into one single light tube safeguarding a uniform exposure of all exposure field areas. However, simply adopting such conventional "moving light" exposure means is precluded by the fact that, on the one hand, the high energy supply resulting in an extremely high heat development, would affect copy, resist and printed circuit board thus resulting in an intolerable heat expansion of the materials and, on the other hand, the substantially non-parallel light emittance for a contact print of the current paths generally vrey narrow, on account of the excessive irradiation envolved therewith, with the finite thickness of the photoresist, will not be possible, i.e. virtually, unavoidable transverse connections of the current paths would result which can, of course, not be accepted. For, the photoresist, for an optimum steep "flank" requires a high energy supply within a short period of time. This, under special conditions, will be realizable by a "moving light", for, this way of exposure, eliminates the generally customary vacuum contact between copy and circuit board in favour of a "soft contact".

SUMMARY OF THE INVENTION

It is, therefore, the object of the invention to improve an exposure device of the afore-mentioned type to the effect that, with a high energy being chargeable, the high amounts of heat developed thereby do not have a negative effect and that the light emerging from the "moving light" is parallel or substantially parallel-directed vertical to the exposure field.

This problem has been solved by an exposure device of the afore-mentioned type provided by the invention through the features referred to in the characterizing clause of the main claim. Advantageous embodiments are set forth in the dependent claims.

It has proved that thanks to this configuration it is possible to supply an energy of about 10 kW to the tubular light source of the moving light, with the heat development envolved therewith having no negative effect. The light directing grid, in known manner, will safeguard a parallel or substantially parallel light emergence in a direction vertical to the exposure field, it being of essence that the reflector, preferably, is a parabolic reflector of parallel ray emergence, and that a heat radiation screen is provided ahead thereof to thereby preclude a massive heat application to the exposure field.

The means for cooling the unit that are essential and required to render the exposure device operable and serviceable, will be explained in the following in greater detail. An advantageous form of embodiment of the exposure device resides in that the air extracting slit and the at least one air inlet port of the housing accommodating the high-intensity light source, are provided with air supply lines. This will consider relatively small mounting spaces for the entire copying system which, in view of the relatively high energy supply, in general, would be heated comparatively rapidly thereby rapidly raising the general heating level. Moreover, the possible requirement of keeping such spaces dust-free can also be complied with as the air is exhausted from outside the said spaces and, after having passed the exposure system, is again blown off outside the said spaces, it being possible, in view of the substantial energy supplied to the device, to utilize the discharged and heated air for heating other spaces.

BRIEF DESCRIPTION OF THE DRAWINGS

The exposure system of the invention will now be described in greater detail with reference to the graphical illustration of some forms of embodiment, wherein FIG. 1 schematically shows a sectional view of one form of embodiment of the exposure system;

FIGS. 3,4 are sectional views of other and special forms of embodiment of the exposure device;

FIG. 5 is a perspective view of a structural detail of the reflector;

FIG. 6 shows the exposure device, viewed in the adjusting direction, and

FIGS. 7,8,9 show forms of embodiment of the light-directing grid.

DESCRIPTION OF PREFERRED FORMS OF EMBODIMENT

Figure 1:
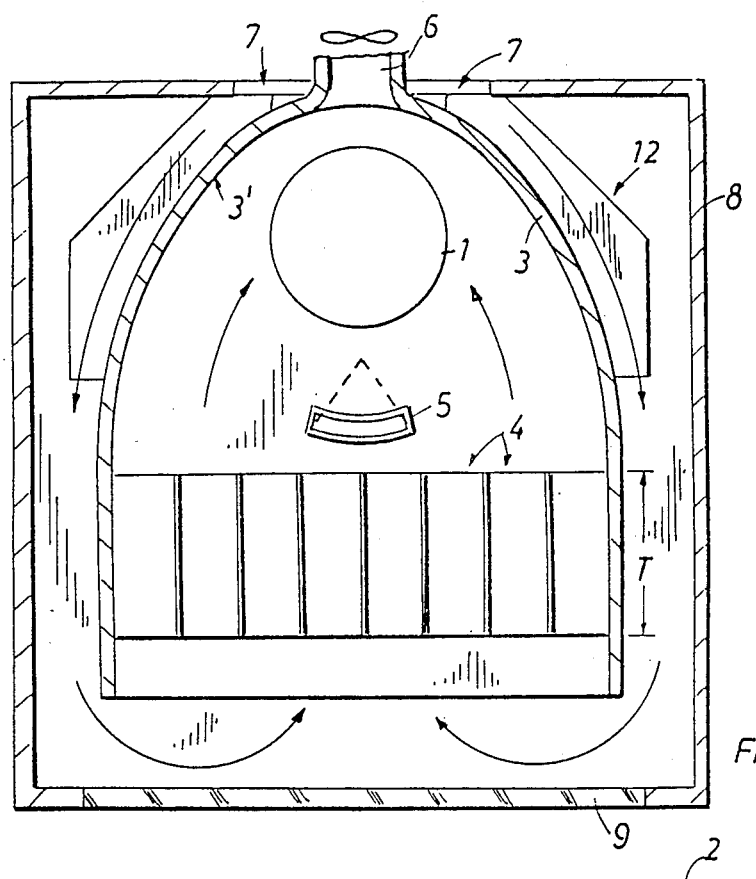
Figure 2:
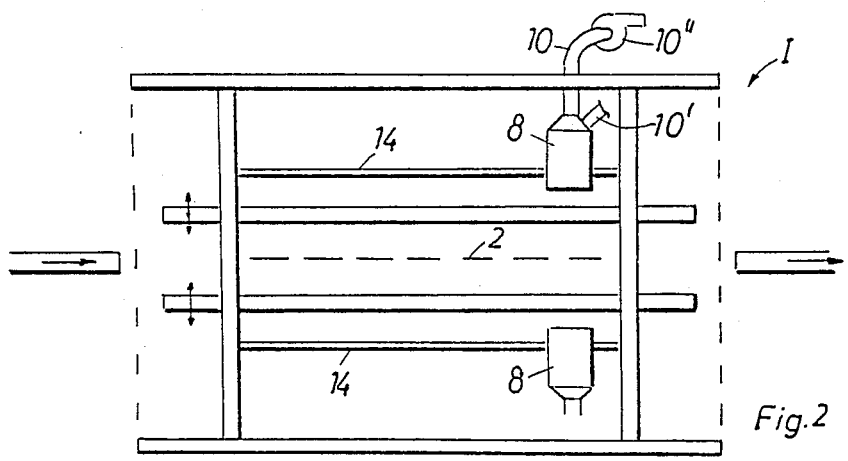
FIG. 2 is a schematical view of the arrangement of the exposure device within the entire copying device.

The exposure device as sectionally shown in FIG. 1 is displaceably disposed in a contact printing device I of a special type which, in the present instance, does not require any detailed explanation (FIG. 2). What alone is essential is that the device is provided with guides 14 along which the exposure device is movable across the exposure field 2.

As shown in FIG. 1, the high-intensity light source 1 having a power input of about 10 kW, is disposed within a reflector 3 open toward the exposure field 2, with the so-called light-directing grid 4 being seated underneath the light source 1 and underneath the reflector 3. As equally disclosed by FIG. 1, the occulting strip 5 swept through, for example, by a coolant, is disposed between the light source 1 and the light-directing grid 4 which strip, as shown in broken lines, in cross-section, can also be of a prismatic configuration for the purpose of a favorable heat radiation reflection. Reflector 3 is provided with an air exhausting slit 6 extending along the entire length thereof; connected thereto is, as shown in FIG. 6, an air exhaust hood 15 having internal deflectors 16 and exhaust line 10. Housing 8 provided with at least one air inlet port 7 is closed by a light-permeable heat insulating plate 9, with the air inlet port 7, as shown in FIG. 1, feasibly, being disposed on top and being provided with line 10' for the air supply. Scavenging the entire housing by air is effected by means of a fan (not shown) connected either at the suction side to the air supply line 10, or at the pressure side to the air supply line 10'.

As shown by arrows in FIG. 1, the air entering through the air inlet port 7, externally washes the reflector 3, then flows downwardly through the light directing grating 4 to reach the interior of the reflector, flowing off therethrough and through the air exhaust slit 6 and the air exhaust hood 15 into the air carrying line 10 thus leaving housing 8 in a correspondingly heated condition. To attain a substantially uniform air distribution throughout the entire housing length, the air inlet port 7, feasibly, is equally of a slit-type configuration, or otherwise a plurality of air inlet ports 7 are provided. Unless the air supply is effected directly from the mounting space of the device, the entire air inlet area is furnished with an air exhaust hood as shown in FIG. 6, to which are then connected the air carrying conduits 10'. This type of air guidance within housing 8, also provides for an intensive cooling of the light-permeable heat insulating plate 9, provision of which is also feasible to safeguard a heat development as low as possible in the area between the heat insulating plate and the exposure field 2. A uniform air washing of the high-intensity exposure source 1 throughout the entire length thereof, equally, is of essence.

The built-in light-directing grid composed, for example, of sheet metal fins disposed cross-wise, will reduce, responsive to the active length and the space between the fins, the intensitiy of light obliquely irradiated, with the "moving light" configuration envolving the advantage that by a temporary exposure at the respective point of the high-intensity exposure field, optimum exposure conditions are provided for the photopolymerization. The light directing grid 4 in housing 8 underneath reflector 3 provides for that uniaxially parallel light is emitted only via reflector 3, with light emitted at any desired angles from the reflector leaving the light directing grid 4 equally substantially in parallel through the built-in light-directing grid provided with an absorbent layer. The afore-mentioned air guidance through housing 8 and then through the light-directing grid and the reflector about the UV light source corresponds to an optimum counter-current cooling and provides for a uniform temperature distribution within the housing and for optimum operating conditions of light source 1.

The heat insulating plate 9 provided on housing 8 protects the interior of housing 8 against the environment such that untreated cooling air can be used within the housing which is of advantage especially if clean space conditions are required which, in particular, is of interest if high-precision copying operations are to be performed by the device. The occulting strip 5 disposed directly underneath the reflector 3 and the light source 1, respectively, depending on the required cooling performance, can be washed with water, thermo-oil, air or other cooling media, with corresponding coolant connections (not shown) being provided laterally of the housing and the strip, respectively.

Reflector 3, feasibly, is disposed in a carrier 12 shaped-adapted to the reflector side and made of a heat conductive material, with the carrier being furnished at the outer side with heat exchanging surface enlargements 13 such as cooling fins or the like, as shown in FIG. 5. This configuration, equally, takes into acount the high heat development, conveying to the actual reflector built in the form of a reflector sheet of thin, mirror-finished material, the required heat stability.

As shown in FIG. 2, housing 8 itself, relative to the exposure field 2, can be movably disposed, with a corresponding housing 8 being also movably disposed underneath the exposure field for exposing the printed circuit board simultaneously from top and bottom. Housings 8 are driven by a linear drive such as a chain, spindle, pneumatic or hydraulic units, toothed belt, linear motor etc.. The control of the drive is set up for a stepless or very finely stepped adjustment of the driving speed and, hence, of the exposure time.

As shown in FIG. 3, it will also be possible to so configure the device that the light source 1 including reflector 3 and light-directing grid 4, is movably located within a stationary housing 8' covering the entire exposure field 2. The said housing 8' is, of course, so constructed as to permit proper ventilation thereof. As light source 1 cannot permanently be turned on and off between the individual exposure operations, but rather operates continuously or is in a stand-by condition, feasibly—and this applies both to the embodiment according to FIG. 3 and to that of FIG. 4—the light source 1 including reflector 3 and light-directing grid 4, is to be configured and disposed to be movable into an end position externally of the heat insulating plate 9. These end positions are at the end of the path of travel for the moving light thereby attaining that with the light source burning, the heat insulating plate 9, in the standby position, is not permanently supplied with heat. These "parking positions", in FIG. 4, are designated by reference numeral 17.

The light-directing grids, in plan view, can be of a configuration as shown in FIGS. 7,8,9. The light-directing grid 4 according to FIG. 7 may be furnished with a small vibratory oscillator 11 to preclude an exposure error if in the moving direction according to the arrows, one of the grid fins directly coincides with a current path which would affect a profiled exposure of the course of the said current path. Alternatively, a slightly canted arrangement of the light-directing grid 4 relative to the direction of travel would also be possible. Another alternative would be the diagonal arrangement of the fins with respect to one another as shown in FIG. 8.

What we claim is:

1. An exposure device, especially for the contact print of circuit patterns on printed circuit boards, composed of a tubular light source extending with the length thereof throughout the entire exposure field width and disposed in a housing light-permeable over the exposure field, with the light source being disposed within a reflector open toward the exposure field and a light-directing grid covered by the lateral flanks of the reflector being located underneath the light source and a heat insulating plate being provided underneath the light directing grid, characterized in that an occulting strip (5) is disposed between the light source (1) movable across the exposure field and the light-directing grid, and the reflector (3) is provided with an air exhausting slit (6) extending throughout the entire length thereof, with the housing (8) provided with at least one air inlet port (7) and enclosing the reflector forming the outer part of a ventilation channel guided about reflector (3) and guided through the reflector.

2. A device according to claim 1, characterized in that the occulting strip (5) is of a hollow formation and is provided with connections for passing a coolant therethrough.

3. A device according to claim 1, characterized in that the occulting strip (5) is formed as a mirroring prism and so disposed that the incident heat radiation is reflected on the outer wall of the reflector.

4. A device according to claim 1, characterized in that the air exhausting slit (6) and the at least one air inlet port (7) of housing (8) is provided with air carrying conduits (10), and the latter are connected, at the suction or pressure sides, to a space independent of reflector (3).

5. A device according to claim 1, characterized in that the at least one air inlet port (7) of housing (8) is disposed above the reflector (3).

6. A device according to claim 1, characterized in that the light source (1) including reflector (3) and light-directing grid (4) is configured and disposed to be movable into at least one end position externally of the heat insulating plate (9).

7. A device according to claim 1, characterized in that the light source (1) with reflector (3) and light-directing grid (4) along with housing (8) enclosing the said elements are disposed to be movable relative to the exposure field (2).

8. A device according to claim 1, characterized in that the light source (1) with reflector (3) and light-directing grid (4) is movably disposed within a stationary housing (8) covering the whole of the exposure field (2).

9. A device according to claim 1, characterized in that the reflector (3) is disposed in a carrier (12) of heat conductive material conforming in shape to the reflector and, on the outer side, is provided with heat exchanging surface enlargements (13), such as cooling ribs or the like.

* * * * *